United States Patent
Brown

(10) Patent No.: US 6,842,357 B2
(45) Date of Patent: Jan. 11, 2005

(54) NONDESTRUCTIVE SENSING MECHANISM FOR POLARIZED MATERIALS

(75) Inventor: Michael A. Brown, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 103 days.

(21) Appl. No.: 10/127,894

(22) Filed: Apr. 23, 2002

(65) Prior Publication Data

US 2003/0198075 A1 Oct. 23, 2003

(51) Int. Cl.$^7$ .............................................. G11C 11/22
(52) U.S. Cl. ...................... 365/45; 365/207; 365/214; 365/233
(58) Field of Search ................................ 365/145, 207, 365/214, 233; 363/21.06, 88; 269/13.3; 360/59.21; 369/13.3

(56) References Cited

U.S. PATENT DOCUMENTS

| | | | | |
|---|---|---|---|---|
| 5,059,761 A | * | 10/1991 | Koel et al. ............ | 219/121.83 |
| 5,151,877 A | * | 9/1992 | Brennan .................... | 365/145 |
| 5,530,667 A | * | 6/1996 | Omura et al. ............... | 365/145 |
| 5,729,488 A | * | 3/1998 | Drab et al. ................. | 365/145 |
| 5,940,021 A | * | 8/1999 | Ahn .......................... | 341/155 |
| 6,055,180 A | | 4/2000 | Gudesen et al. | |
| 6,175,189 B1 | * | 1/2001 | Brooks ....................... | 315/119 |

\* cited by examiner

*Primary Examiner*—Connie C. Yoha
(74) *Attorney, Agent, or Firm*—Marger Johnson & McCollom, P.C.

(57) ABSTRACT

A circuit for non-destructive sensing of polarized materials includes a signal generator to generate a periodic, alternating voltage signal. The alternating voltage signal is applied to at least one cell of polarized material, such that the cell produces a cell output signal. A synchronous rectifier then rectifies the cell output waveform into positive and negative rectified signals. A differentiating amplifier receives the positive and negative rectified signals and produces an output signal wherein the output signal represents a data state of the cell.

16 Claims, 4 Drawing Sheets

NONDESTRUCTIVE SENSING MECHANISM FOR POLARIZED MATERIALS

BACKGROUND

Polarized materials include ferroelectric and magnetic materials. For purposes of this discussion, polarized materials will include any material capable of being polarized, whether they are currently polarized or not. The material has a polarization of one state or the opposite state, such a positive or negative polarity. The polarization state often depends upon the nature of the polarizing force applied. For example, ferroelectric materials will assume a positive or negative polarization with application of an electric field. In some materials, application of a positive electric field will cause the material to assume a positive polarity. In many polarizable materials, the hysteresis loop of the material exhibits a non-linear slope during the application of the forcing function.

Once a polarized cell has been polarized to a particular state, and that state is correlated to a 'one' or a 'zero,' that data will be retained for a period of time and in some cases indefinitely. However, current techniques for sensing the state of the cell are 'destructive' in that the sensing operation causes the cells to assume one of the two states, nominally the 'zero' state. A charge release caused by the forcing of the cell to the 'zero' state is the mechanism sensed to determine the state of the cell. For example, if a 'one' state is of positive polarity, the cell is switched to negative polarity and the charge released is sensed. However, in the process, the data state changed from 'one' to 'zero.' For 'zero' state cells, the cell does not change states. However, in order to preserve the data in the cells in the one state, the data must be stored and rewritten into the cells after the read cycle. This is time consuming, power consuming and inefficient.

Therefore, it would be useful to have a robust, nondestructive means for sensing the polarization state of polarized materials.

BRIEF DESCRIPTION OF THE DRAWINGS

The invention may be best understood by reading the disclosure with reference to the drawings, wherein.

DETAILED DESCRIPTION OF THE EMBODIMENTS

Figure 1:
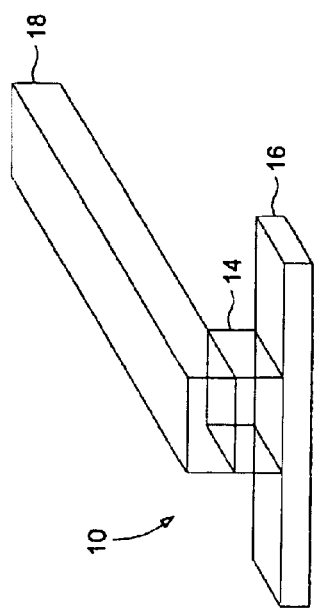
FIG. 1 shows an example of a polarized ferroelectric material memory cell.

FIG. 1 shows one example of a cell in a ferroelectric memory array. The cell 10 has an electrode layer 16, a ferroelectric material layer 14 and a second electrode layer 18. The arrangement of FIG. 1 is provided for ease of discussion and many other arrangements of the ferroelectric material may be used, as well as many other arrangements of the electrode or other addressing means. For purposes of discussion, however, the arrangement of FIG. 1 will be used and the region of ferroelectric material located at the cross over point between the two electrode layers will be referred to as a cell. One application of such a region may be a memory cell, and that example will be used here with no intention of limiting the scope of the invention.

Figure 2:
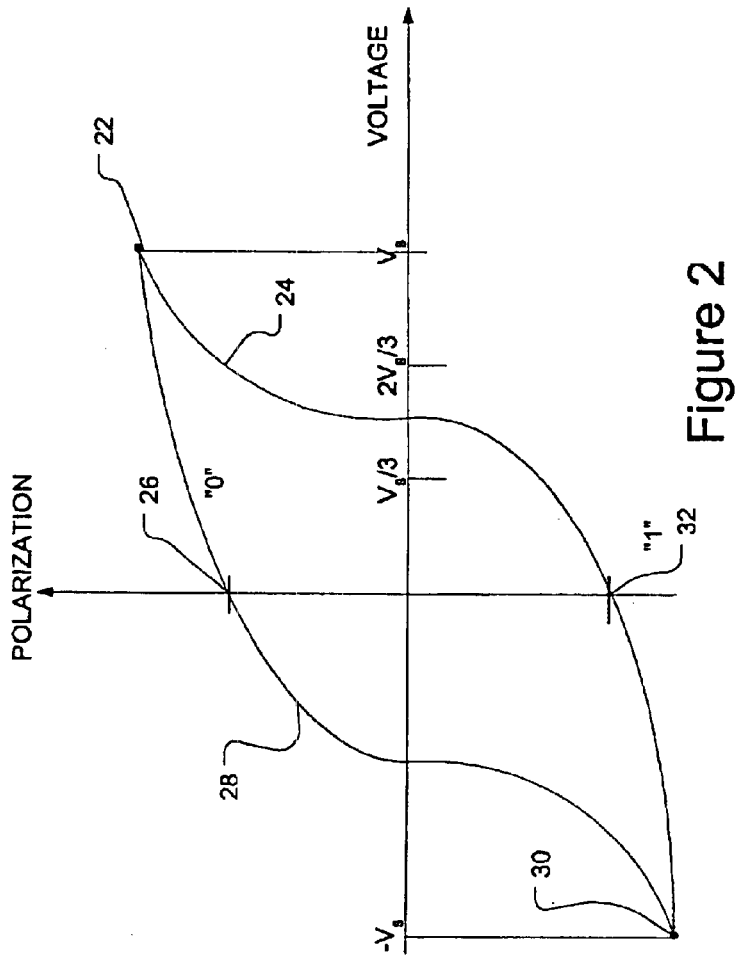
FIG. 2 shows a polarization versus applied voltage hysteresis curve for a polarized material memory cell, in accordance with an embodiment of the invention.

If there were a memory cell, the data value in the cell would be either a one '1' or a zero '0'. The value of the cell is determined by the polarization of the material versus the voltage being applied. Referring now to FIG. 2, a polarization versus voltage hysterisis curve demonstrates the nature of the memory cell and how it stores data values of ones or zeros. Control of the voltages applied to the active word line and active bit line may cause the material to experience a polarization shift. The differential voltage seen at the cell is due to a voltage differential between the two electrode layers 16 and 18.

FIG. 2 has as its horizontal axis this differential voltage. The vertical axis is the polarization of the material at the cell and is represented by the change in current flow from the cell as the voltages are applied across the cell. The origin of the axes corresponds to zero voltage and zero polarization. FIG. 2 shows a typical polarization versus voltage curve. A characteristic of certain types of ferroelectric and magnetic materials is that the hysterisis curve is not square. This characteristic provides an alternative opportunity to sense the state of the polarization, 'reading' the cell, other than a destructive read process. One application of this invention will exploit this non-linear behavior to sense the state of polarization of the material. It is helpful to first discuss manipulation of the polarization state.

When a negative voltage $-V_s$ is applied to the material, the polarization versus voltage profile follows the left path 28. The voltage used here may be referred to as the 'saturation' threshold voltage, in that it is the voltage level that causes the polarization state to change. This occurs as the polarization of the ferroelectric material switches from positive to negative polarity. Changes in polarization take time and eventually the polarization settles at the polarization level corresponding to the negative saturation voltage $-V_s$, as shown at the bottom of the leftmost path at 30. When the magnitude of the applied voltage is removed, the material retains a remanent polarization shown as a data value one on the vertical axis at 32, labeled as a "1".

Similarly, when a positive saturation voltage $V_s$ is applied to electrode layer 16 relative to electrode layer 18, the polarization versus voltage profile follows the right side path, settling at the polarization level corresponding to the positive saturation threshold voltage, as shown at the top of the rightmost path at 22. When the applied voltage is removed, the remnant polarization shown as a data value zero on the vertical axis shown at 26, labeled as a "0". The cell then retains whichever of the remanent polarity states, until a read cycle, the known forcing of the cell to a predefined state, is performed, during which the current state of the polarity of the cell is detected by sensing the amount of charge transferred from the cell.

In order to determine the current state of polarity of a cell, current approaches apply the saturation voltage $V_s$ to the polarized cell. This application of a voltage causes a polarization shift. For the data value zero, where the cell has positive polarity at zero voltage, application of the saturation voltage produces little to no charge out.

The zero state corresponds to a positive polarity of the material, so application of a positive voltage 'drives' the state of the cell towards the saturation polarization from point 26 to point 22. As can been seen, little or no polarization shift occurs. The low polarization shift results in a very small charge release. The sense amplifier assigned to that cell detects no charge release or a minimal charge release below a predefined threshold. This lack of charge release is then manipulated to produce a data value of 'zero' for that memory cell in the read operation.

However, application of the saturation voltage to the cells having negative polarity at zero voltage does cause a polarity reversal and an associated charge release. The 'one' was stored by application of a negative voltage differential across the electrode layers, resulting in negative polarity shift. As the polarity shifts, the state of the cell is driven from point 32 to point 22, resulting in a relatively large charge release. This charge release is sensed and manipulated to produce a data value of 'one' for that memory cell in the read operation.

Current approaches that drive the polarity of the cell to point 22 essentially delete the data value of the cell, write a value of '0' if that cell had a one value. Driving the polarity of the cell to point 22 reverses the polarity of the material. Therefore if the cell is to be considered to be a static indicator of a prescribed value, the data value must be stored externally to the polarized material. In this example, where the polarized material acts as a memory, the material may be organized into a memory array and the value of one must be associated with the particular cell of the array. After the read cycle is completed, all of the 'one' values would then have to be restored back into the memory array, typically by performing a write cycle. This cycle of reading the cell contents while destroying the contents in the process is referred to as a destructive read.

Figure 3:
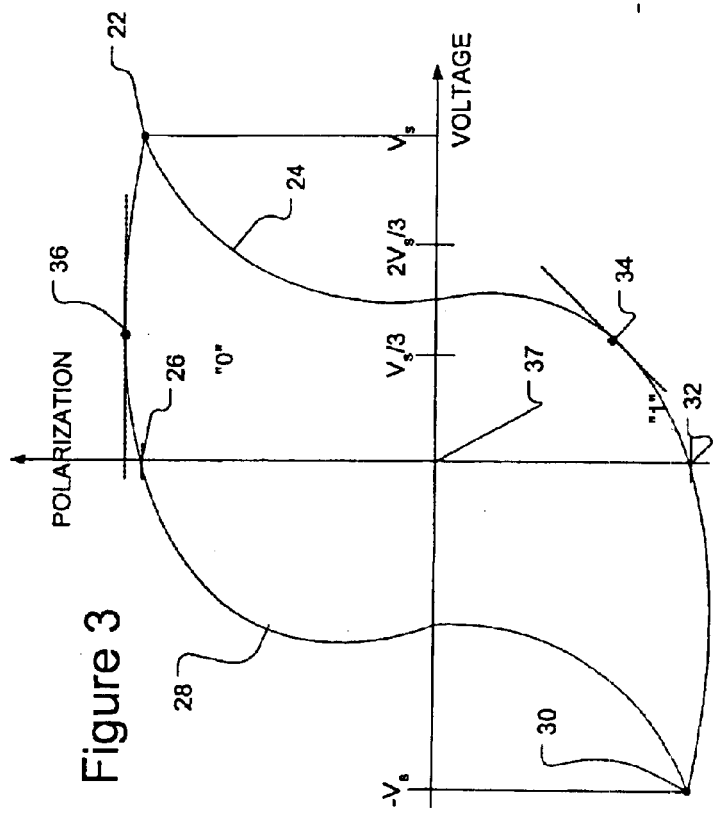
FIG. 3 shows a more detailed exaggerated view of the slope of a hysteresis curve detectable by non-destructive read processes, in accordance with an embodiment of the invention.

It is possible to detect the polarity of the material without modifying the contents of the memory cell. Referring now to FIG. 3, it can be seen that the hysteresis curve is asymmetrical at the remnant polarity points of 26 for a zero and 32 for a one. An embodiment of the invention may rely on the fact that the horizontal slope be slightly non-linear about the vertical axis.

The slopes of the curves are demonstrated by the reference points 26 and 32, with the dashed lines depicting the slope of the curve at those points. As can be seen by these dashed lines, their slopes are different. Looking at points, 34 and 36, to the right of 26 and 32, and observing the slopes of the curve through these points, it is obvious that the waveform about 26 and 32 is non-linear though the vertical axis even though it is symmetrical about the origin, 37. The change in polarity for a cell with a zero state to which a positive voltage is applied is minor when compared to the change in polarity for a cell with a one state. The similar but reversed condition exists for application of a negative voltage to a cell with a zero state.

If an small alternating voltage, such as an alternating sinusoidal (AC) waveform, were applied to a one cell, where the magnitude of the peaks were considerably less than the saturation threshold voltage $V_s$, the polarity would cycle between the remanent polarity point and some point along the appropriate path. For example, if a cell were at the remanent polarity point for a data one, the polarity would cycle between point 32 and somewhere along the path towards point 22 for positive voltage and between point 32 and somewhere along the path towards point 30. A characteristic typical of materials having these non-square, rounded hysterisis curves is that they may use a relatively high voltage level to cause them to change polarity. When only a fraction of that voltage is applied, the polarity shifts or changes slightly, but returns to the remanent polarity state upon removal of the voltage.

The change in polarity, or charge transfer, about these remanent polarity points is asymmetrical. If an output waveform were created for the cell charge output, the portion of the waveform for the positive portion of the alternating current would be much larger than that of the negative portion. This is shown in the graphs of FIG. 4.

Figure 4:
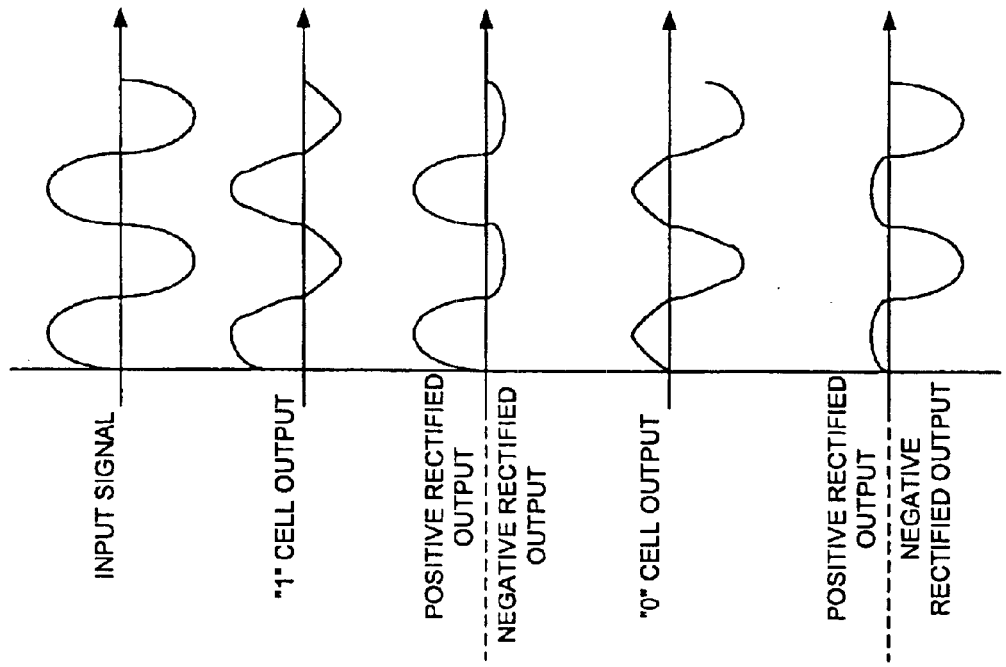
FIG. 4 shows an embodiment of input and output waveforms for polarized materials, in accordance with the invention.

In FIG. 4, the input signal is shown as a sine wave. This input signal is the signal applied to the cells for which the polarity is to be sensed. However, any periodic, AC waveform could be used. However it is desirable to limit the energy slew rate of the input signal and therefore a sine or triangle waveform would produce a reduced energy strain gradient induced across the cell. As can be seen by the "1" Cell Output graph, the application of a positive voltage results in a charge release that is far larger than the application of a negative voltage as discussed above. Rectification and separation of this waveform results in two different outputs. The magnitude of the positive rectified output is far larger than that of the negative rectified output. This difference between the two cell states can be seen by comparing the "0" Cell Output and the rectified waveforms to those for the "1" Cell Output or by comparing either of the outputs to a predetermined threshold. It is preferable to have the detection mechanism be self compensating, so comparing the difference between the two outputs provides a more robust method of detection.

Figure 5:
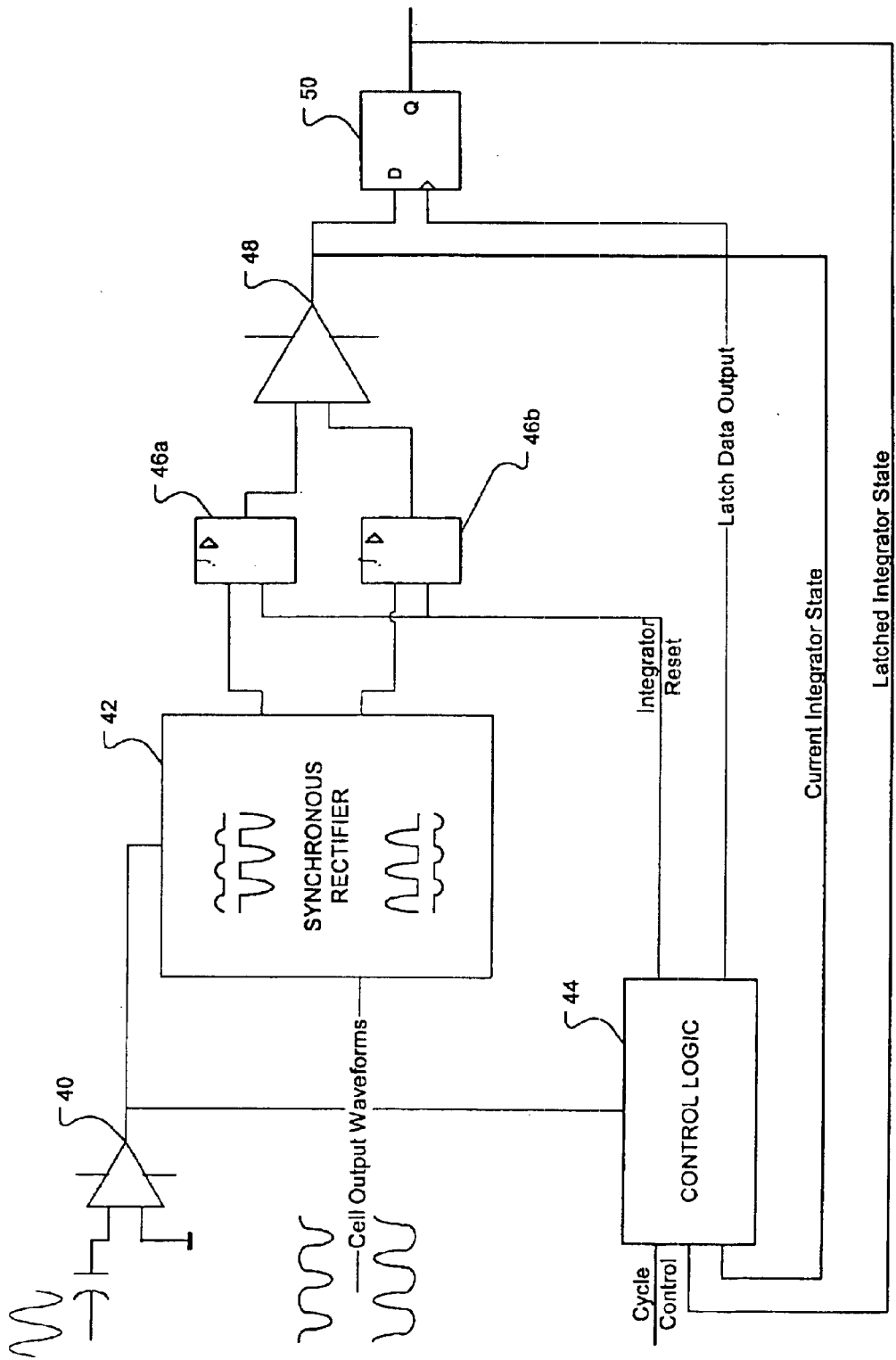
FIG. 5 shows an embodiment of a polarization detection circuit, in accordance with the invention.

An example of a circuit to take advantage of this difference in sensing the polarity states is shown in FIG. 5. The input signal is provided at 40 for synchronization with the signal as applied to the cells of the polarized material. The cell output waveforms are transmitted to a synchronous rectifier 42 that, acting as a synchronous switch, produces two output signals, one for the positive portion of the waveform and one for the negative portion of the cell output wave form. The synchronous rectifier 42 will be discussed in more detail with regard to FIG. 5. The two output signals of the synchronous rectifier are then provided to the integrators 46a and 46b which produce step output voltages proportional to the signals received from the rectifiers. A synchronous rectifier is utilized to eliminate the forward conduction voltage of a diode scheme and to facilitate fabrication in a CMOS process. The circuits provide the stimulus waveform and therefore it can readily provide the controls that indicate the timing and phase of the stimulus waveform. By eliminating the diodes, the simplified detection of the non-linear output currents is extended to lower non-linear values.

The signals received from the rectifiers are the positive and negative portions of the cell output waveforms, as discussed with regard to FIG. 4. The resulting signals from the integrators essentially become a large voltage step and a small voltage step. Determining which integrator produces the large voltage step then determines whether the positive or the negative portion of the waveform is larger.

For example, if integrator 46a is the 'positive' integrator in that it receives the rectification of the positive portion of the cell waveform, assume that it has the larger voltage step. This corresponds to the positive portion of the waveform being much larger than the negative portion, which is the characteristic of a cell having a one state. Therefore, if the integrator 46a produces a larger voltage than integrator 46b, the data state of the cell is a one. The output signals of the integrators 46a and 46b are provided to a differential amplifier acting as a comparator 48. The output signal of the amplifier 48 is then latched by the latch 50. Control logic module 44 provides the signals to control the various components of the sensing circuit.

Many different variations on this circuit are possible. For example, the data latch 50 may be any type of component that can receive an input, store it and provide an output signal representing the input signal. Similarly, the composition and nature of the component or components of the control logic may range from a single integrated circuit controller to a number of smaller components that provide management of the integrators and latch. The specific choices of these and other components are left to the system designer.

Figure 6:
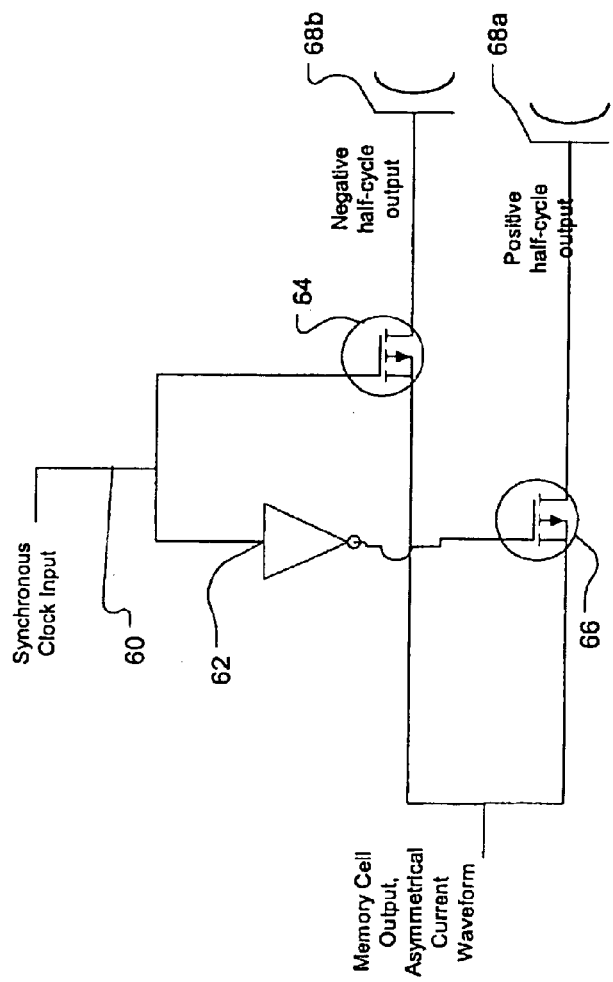
FIG. 6 shows an embodiment of a synchronous rectifier in accordance with the invention

Similarly, the actual composition of the synchronous rectifier 42 is also left to the system designer. An example of such a circuit is shown in FIG. 6, but is only for demonstration purposes, and is not intended to limit the scope of the invention in any way.

The circuit has as its inputs a synchronous clock signal 60, such as a square-wave clock signal, and the output of the memory cell. The output of the memory cell 62 is a signal similar to those shown as an example in FIG. 4. When the clock is in its negative half-cycle and the output of the memory cell is also negative, the negative half-cycle output would be that as shown in the bottom curve of FIG. 4. The outputs for both the negative and positive half-cycles are stored in the accumulation capacitors 68a and 68b when passed by pass transistors 64 and 66, respectively. The detection of this asymmetry is what leads to the determination of the state of the memory cell.

This circuit is merely intended as an example. Further, the use of the accumulation capacitors is optional, within this example. However, the use of the accumulation capacitors may increase the accuracy and sensitivity of the sensing function. For example, a relatively slow, periodic, AC waveform could be applied to the cells to generate the output waveforms, such as a 10 MHz sine wave. The capacitor could be set up to accumulate the charge to be sensed by the integrator, or a more likely, a sense amplifier attached to the integrator. The sensing cycle could correspond to a number of cycles of the AC waveform, such as sensing every 10 or 20 cycles of the AC waveform. In this manner, the difference between the positive and the negative portions of the waveform may be larger and allow for more accurate detection of the polarity state of the cell.

This approach to sensing the polarity state of the cell is non-destructive and therefore eliminates the need for external storage of the contents of the cells, when the cells are used as a memory array. Similarly, the requirement for a 'write back' cycle to restore the contents of the cells is also eliminated. This may result in the use of polarized material memory devices to be more efficient and practical for use in many different applications.

A further enhancement is made by deterministically selecting the termination state of the input waveform after the value, a 'one' or a 'zero' has been detected in the cell. If a 'one' is detected in the cell, then the input waveform is terminated at or near the maximum negative voltage, thus minimizing any disturbance in the cell and restoring any lost cell ferroelectric remnants. If a 'zero is detected in the cell, then the input waveform is terminated at or near the maximum positive voltage.

Figure 7:
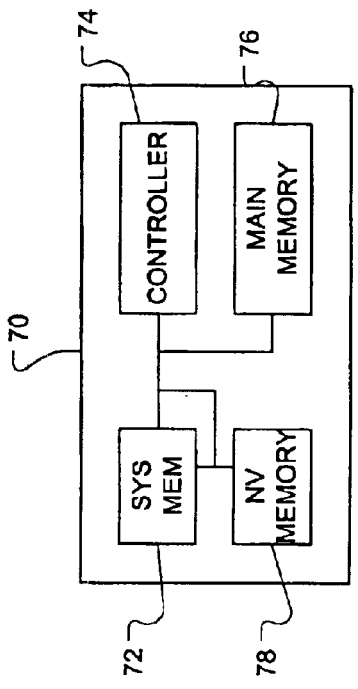
FIG. 7 shows a block diagram of a system including a memory comprised of polarized material, in accordance with an embodiment of the invention.

An example of one such application is shown in FIG. 7. In this example, the polarized material is used as a non-volatile memory array for an apparatus having a system memory and a memory controller. This may include large, complex systems such as personal computers and servers, or smaller, simpler devices, such as personal digital assistants (PDA), or cellular phones. The system 70 may include a system memory, also referred to as a 'cache' memory 72. Generally, this memory is static, random access memory (SRAM), but may be of other memory types as well. The non-volatile memory 78 acts as a non-volatile storage for the contents of the system memory.

The system shown here also includes a controller 74, to provide control of the process of communication between the system memory 72 and the non-volatile cache memory 78. The system may also include a main memory 76, such as a disk drive. However, these two components are optional and are only provided as an example. In this example, the non-volatile memory may include a non-destructive sensing circuit as discussed with regard to FIG. 5.

Thus, although there has been described to this point a particular embodiment for a method and apparatus for non-destructive reading of polarized materials, it is not intended that such specific references be considered as limitations upon the scope of this invention except in-so-far as set forth in the following claims.

What is claimed is:

1. A circuit, comprising:
    at least one cell of polarized material, wherein the cell is coupled to an alternating signal and produces an asymmetrical hysteresis cell output waveform;
    a synchronous rectifier to sample the asymmetrical cell output waveform into positive and negative signals; and
    a differential amplifier to receive the positive and negative signals and to produce an output signal depending upon the difference between the positive and negative signals, wherein the output signal represents a data state of the cell.

2. The circuit of claim 1, wherein the circuit includes a signal generator to generate a periodic, alternating signal.

3. The circuit of claim 1, wherein the circuit includes integrators to sample the positive and negative signals.

4. The circuit of claim 1, wherein the circuit includes a data latch to latch the output of the differential amplifier.

5. The circuit of claim 1, wherein the circuit includes a controller to control operation of the circuit.

6. The circuit of claim 1 wherein the synchronous rectifier further comprises:
    a first pass transistor to receive the cell output waveform and to produce a first output signal;
    a second pass transistor to receive the cell output waveform and to produce a second output signal; and
    a synchronous clock signal to provide an input to enable the first and second pass transistors.

7. The circuit of claim 6, wherein the circuit further comprises inverter to invert the synchronous clock signal prior to being provided to the second pass transistor if the same type of transistor is utilized to minimize threshold offsets.

8. The synchronous rectifier of claim 6, wherein the rectifier further comprises a first and a second capacitor electrically coupled to the first and second pass transistor, respectively.

9. A system, comprising:
    a non-volatile memory, wherein the non-volatile memory is comprised of a polarized material that produces an asymmetrical output waveform; and a non-destructive sensing circuit comprising:
- a synchronous rectifier to sample the asymmetrical cell output waveform into positive and negative signals; and
- a differential amplifier to receive the positive and negative signals and to produce an output signal depending upon the difference between the positive and negative signals, wherein the output signal represents a data state of the cell.

10. The system of claim 9, wherein the system further comprises system memory, and the non-volatile memory is operable to store contents of the system memory.

11. The system of claim 10, wherein the system further comprises a memory controller operable to control communication between the system memory and the non-volatile memory.

12. The system of claim 9, wherein the polarized material further comprises a polymer ferroelectric material.

13. The system of claim 9, wherein the polarized material is characterized by a non-square polarization transfer function versus voltage hysteresis curve.

14. A method to sense the state of a cell of a polarized material, the method comprising:
applying a periodic, alternative signal to the cell, causing the cell to produce an asymmetrical output signal; and
determining the state of the polarity by:
- performing synchronous rectification upon the cell output waveform to sample the asymmetrical output signal into positive and negative rectified signals;
- amplifying a difference between at least one of the positive signal, the negative signal and a threshold signal; and
- determining the state of the cell using the difference.

15. The method of claim 14 wherein determining the state of the polarity of the cell comprises comparing only one rectified signal against the predetermined threshold voltage.

16. The method of claim 14 wherein determining the state of the cell utilizes many cycles of the input waveform with the outputs rectified and integrated to increase the sensitivity of the mechanism.

* * * * *